(12) United States Patent
Yadav

(10) Patent No.: US 8,321,771 B1
(45) Date of Patent: Nov. 27, 2012

(54) MODIFIED TRACE-BACK USING SOFT OUTPUT VITERBI ALGORITHM (SOVA)

(75) Inventor: Manoj Kumar Yadav, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 529 days.

(21) Appl. No.: 12/572,329

(22) Filed: Oct. 2, 2009

Related U.S. Application Data

(60) Provisional application No. 61/104,892, filed on Oct. 13, 2008.

(51) Int. Cl.
*H03M 13/03* (2006.01)
*H04L 5/12* (2006.01)
*G01R 31/08* (2006.01)

(52) U.S. Cl. ........ 714/795; 714/792; 714/794; 714/799; 714/821; 704/242; 375/265; 370/216; 370/241

(58) Field of Classification Search ............. 714/792, 714/794, 795, 799, 821; 704/242; 375/265; 370/216, 241
See application file for complete search history.

(56) References Cited

U.S. PATENT DOCUMENTS

| | | | | |
|---|---|---|---|---|
| 5,280,489 | A * | 1/1994 | Fredrickson et al. | 714/788 |
| 5,537,424 | A * | 7/1996 | Karabed et al. | 714/795 |
| 6,581,182 | B1 * | 6/2003 | Lee | 714/795 |
| 6,704,903 | B1 * | 3/2004 | Leung et al. | 714/796 |
| 6,931,585 | B1 * | 8/2005 | Burd et al. | 714/795 |
| 7,089,483 | B2 * | 8/2006 | McEwen et al. | 714/795 |
| 7,155,660 | B1 * | 12/2006 | Burd | 714/795 |
| 7,222,288 | B2 * | 5/2007 | Varma et al. | 714/795 |
| 7,725,800 | B2 * | 5/2010 | Yang et al. | 714/755 |
| 7,765,458 | B1 * | 7/2010 | Yang et al. | 714/795 |
| 7,805,664 | B1 * | 9/2010 | Yang et al. | 714/794 |
| 7,917,836 | B1 * | 3/2011 | Burd | 714/795 |
| 8,037,393 | B2 * | 10/2011 | Djurdjevic et al. | 714/780 |
| 8,037,394 | B2 * | 10/2011 | Djurdjevic et al. | 714/780 |
| 8,040,953 | B2 * | 10/2011 | Yang et al. | 375/240.18 |
| 2010/0235718 | A1 * | 9/2010 | Yang et al. | 714/780 |

* cited by examiner

*Primary Examiner* — John J Tabone, Jr.

(57) ABSTRACT

Systems and methods are provided for generating error events for decoded bits using a Soft output Viterbi algorithm (SOYA). A winning path through a trellis can be determined and decoded information can be generated. Path metric differences can be computed within the trellis based on the winning path. A plurality of error event masks and error event metrics can be generated based on the decoded information and the path metric differences.

20 Claims, 13 Drawing Sheets

US 8,321,771 B1

MODIFIED TRACE-BACK USING SOFT OUTPUT VITERBI ALGORITHM (SOVA)

CROSS-REFERENCE TO RELATED APPLICATIONS

This application claims the benefit under 35 U.S.C. §119 (e) of U.S. Provisional Application No. 61/104,892, filed Oct. 13, 2008. The disclosure of this application is hereby incorporated by reference in its entirety.

This application is related to U.S. patent application Ser. No. 11/518,020, entitled "ERROR PATTERN GENERATION FOR TRELLIS BASED DETECTION AND/OR DECODING," and filed on Sep. 8, 2006. This application is also related to U.S. Patent Publication No. 2008/0008272, entitled "RELIABILITY METRIC GENERATION FOR TRELLIS-BASED DETECTION AND/OR DECODING," and published on Jan. 10, 2008. The disclosures of this application and this publication are hereby incorporated by reference in their entirety.

BACKGROUND

This disclosure relates to identifying errors in a communication signal. More particularly, this disclosure relates to identifying potential error events, including error event masks and error event likelihood metrics, in connection with soft output Viterbi algorithm (SOVA) trellis-based detection and/or decoding.

Consider a system that can be represented by a finite state machine. For example, a finite state machine can be used to model an inter-symbol-interference (ISI) channel or a convolutional code encoder. A trellis diagram can be used to represent the sequence of all possible paths (i.e., sequences of states) that the system can visit over time. If the system can transition from state A at time t to state B at time t+1, then these states are connected by a branch. Each branch may be labeled by X/Y pair, where X denotes the input that causes the system to transition from state A to B and Y represents an output corresponding to this transition. For example, an ISI channel with a two-bit channel response can be represented by a four-state trellis diagram. The states of this trellis can be labeled as 00, 01, 10, 11 and may be associated with the latest two bits transmitted through the ISI channel. For example, if the system is at state 01 at time t, and 0 is transmitted, then the next state at time t+1 would be 10. Similarly, the system would transition to state 11 if 1 were transmitted. Channel output Y that results from these transitions is a real number m, that may be different for each branch.

In the convolutional encoding situation, an encoder receives input bits and generates output bits that are weighted sums of the input bits.

In the ISI channel situation, the signals at the output of the ISI channel are detected by a trellis-based detector, such as a Viterbi (maximum-likelihood) detector. In the convolutional encoder situation, the bits at the output of the encoder (also called "parity bits") are communicated to a receiver and are decoded using a Viterbi decoder. In either situation, the detector/decoder is based on the trellis representing the ISI channel or the convolutional encoder. However, a Viterbi detector/decoder does not know the particular path that occurred in the trellis of the ISI channel/convolutional encoder. Rather, the Viterbi detector/decoder must use the signals/bits it receives and find the trellis path that most-likely occurred based on the received signals/bits. This detection/decoding is often complicated by the presence of noise or errors in the received signals/bits. In some situations, the trellis path that most-likely occurred based on the received signals/bits may not be the same as the trellis path that actually occurred in the ISI channel/convolutional encoder. In such situations, another layer of error-correction may be applied before the ISI channel/convolutional encoding, so that any errors that may remain after Viterbi detection/decoding can be addressed. In this case, it may be helpful to determine the potential location and nature of these errors and to provide this information to the additional layer of error-correction for its consideration.

SUMMARY

In accordance with some embodiments, a soft output Viterbi algorithm (SOVA) system can be provided for generating error events for decoded bits. The system can include an add-compare-select (ACS) circuit that determines a winning path through a trellis, generates decoded information based on the winning path, and computes path metric differences from the trellis based on the winning path. A trace-back circuit generates a plurality of error event masks based on the decoded information and the path metric differences from the ACS circuit. An error event metric circuit calculates an error event metric for each of the plurality of error event masks based on the path metric differences. A selection circuit selects one or more error event masks based on the error event metrics of the plurality of error event masks. The system can also include an error event optimizer circuit that reduces a bit-length of the selected one or more error event masks and reduces a bit-length of the error event metrics of the selected one or more error event masks.

In some embodiments, the error event optimizer circuit of the SOVA system can reduce the bit-length of the selected one or more error event masks from 13 bits to 8 bits and reduces the bit-length of the error event metrics of the selected one or more error event masks from 6 bits to 5 bits.

In some embodiments, the ACS circuit of the SOVA system can generate a target bit and a virtual bit. The ACS circuit can also compute path metric differences from the trellis for both the target bit and the virtual bit. The trace-back circuit can generate the plurality of error event masks for both the target bit and the virtual bit based on decoded information of the target bit. The error event metric circuit can calculate error event metrics for the plurality of error event masks based on decoded information of the target bit.

In accordance with some embodiments, error events for decoded bits in a decoder using a soft output Viterbi algorithm (SOVA) can be generated as follows. A winning path through a trellis can be determined. Decoded information can be generated based on the winning path through the trellis. Path metric differences can be computed within the trellis based on the winning path. A plurality of error event masks can be generated based on the decoded information and the path metric differences. An error event metric can be generated for each of the plurality of error event masks based on the path metric differences. One or more error event masks can be selected based on the error event metrics of the plurality of error event masks. The bit-length of the selected one or more error event masks and the bit-length of the error event metrics of the selected one or more error event masks can be reduced.

In some embodiments, reducing the bit-lengths of the error event masks and error event metrics can include reducing the bit-length of the selected one or more error event masks from 13 bits to 8 bits and reducing the bit-length of the error event metrics of the selected one or more error event masks from 6 bits to 5 bits.

In some embodiments, a target bit and a virtual bit can be generated using SOVA. Path metric differences can be computed from the trellis for both the target bit and the virtual bit. Error event masks can be generated for both the target bit and the virtual bit. The error event masks for the virtual bit can be selected based on decoded information of the target bit. Error event metrics can be generated for both the target bit and the virtual bit. The error event metrics for the virtual bit can be selected based on the decoded information of the target bit.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which.

DETAILED DESCRIPTION

The disclosed technology provides systems and methods for identifying potential error events, including error event masks and error event metrics, in connection with trellis-based detection/decoding. As used herein, the term "information" will refer to binary digits that may be physically embodied in many ways that are known in the art. As used herein, in the case of convolutional encoding, information to be encoded will be referred to as "user information," and information produced by an encoder based on user information will be referred to as "parity information." User information may include information that has already been encoded by some type of encoder.

Figure 1A:
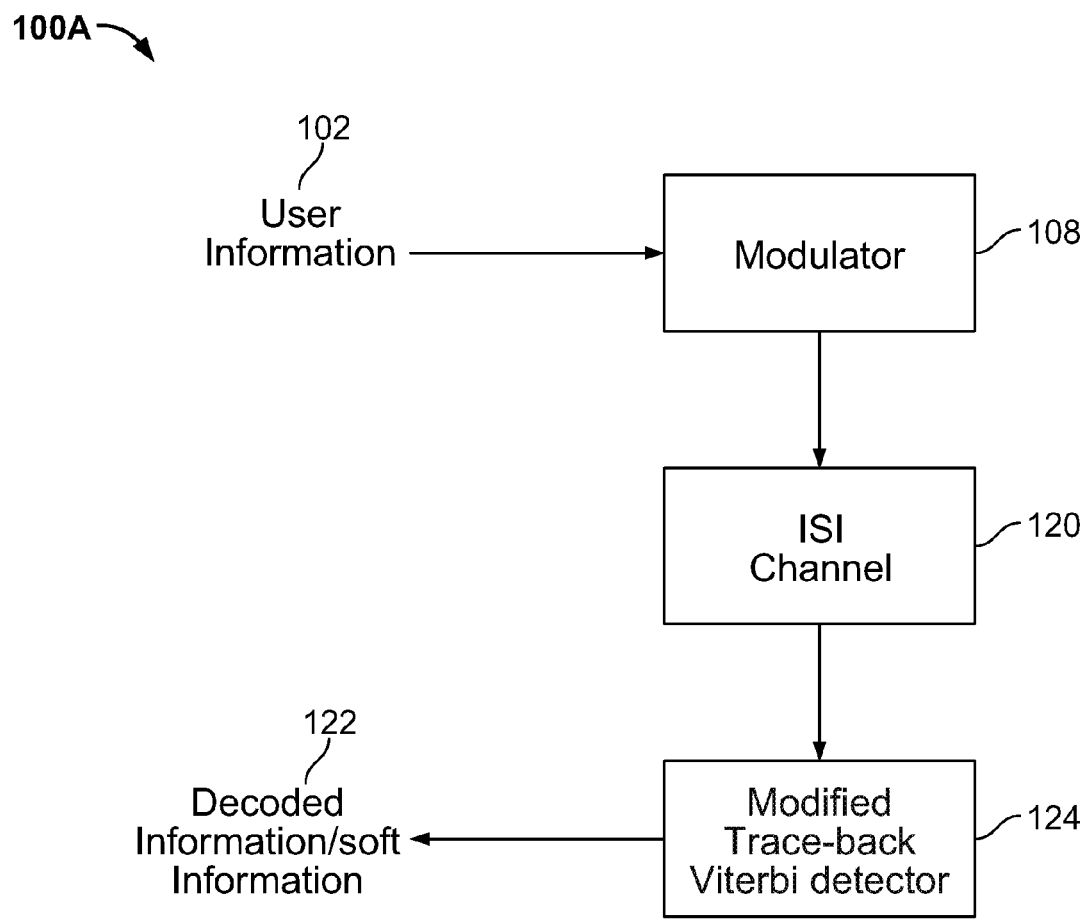
FIG. 1A is a block diagram of an exemplary system that includes an ISI channel and a modified trace-back Viterbi detector in accordance with some embodiments.

Referring to FIG. 1A, there is shown an exemplary communication/storage system 100A that includes an inter-symbol interference (ISI) channel 120. The system includes user information 102 that is intended for communication/storage. The user information 102 can be modulated by a modulator 108, which can perform electric-, magnetic-, or optical-based modulation, or another type of modulation. The modulator 108 transforms the user information 102 into signals (not shown), which are received by the ISI channel 120. The signals at the output of the ISI channel 120 may be weighted sums of the signals received by the ISI channel 120. The modified trace-back Viterbi detector 124 receives the signals at the output of the ISI channel 120 and produces decoded information and/or soft information 122 based on the ISI channel's output signals (not shown). If there are no errors in the decoded information 122, the decoded information 122 will be the same as the user information 102.

Figure 1B:
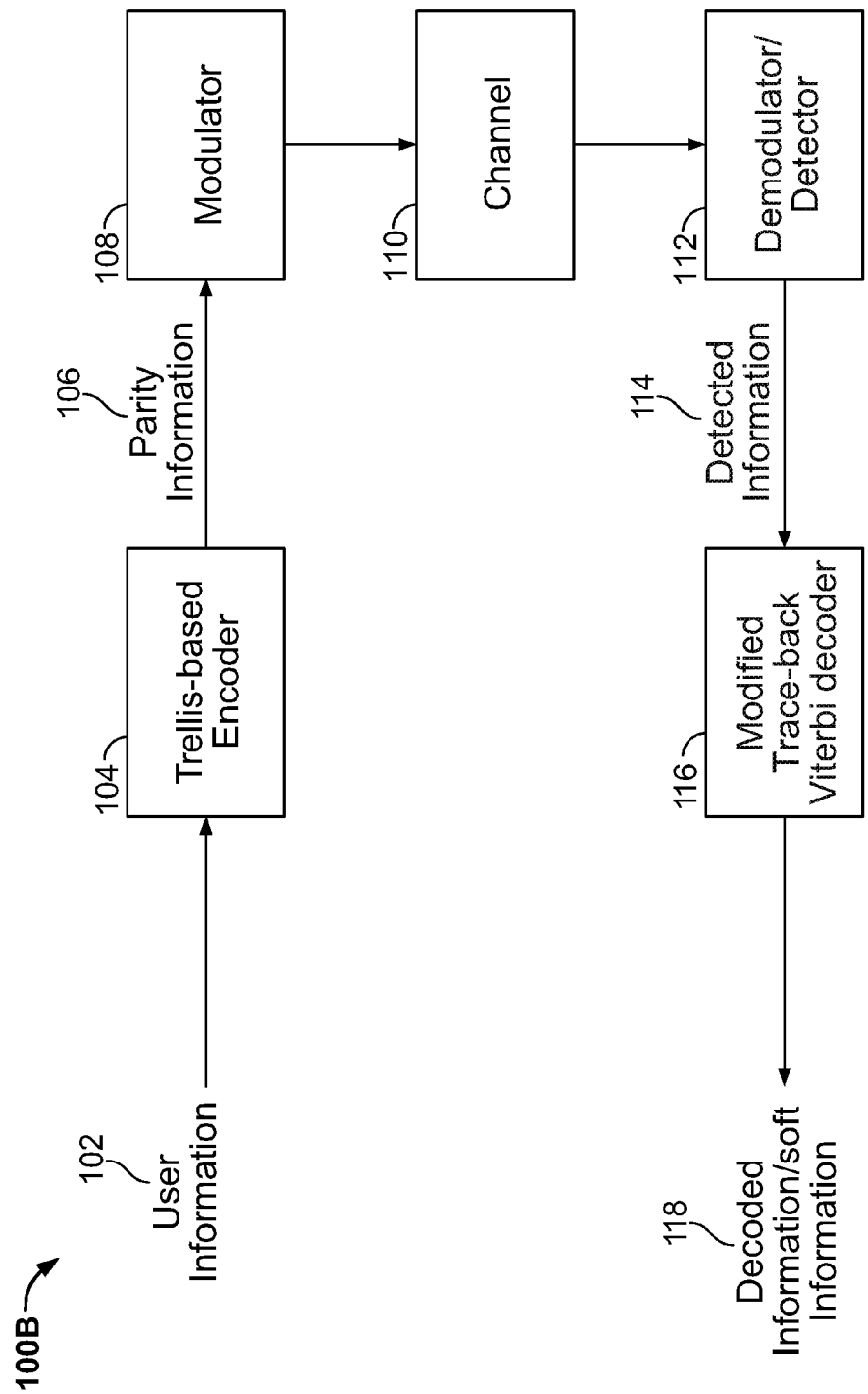
FIG. 1B is a block diagram of an exemplary system that uses a trellis-based code and a modified trace-back Viterbi decoder in accordance with some embodiments.

Referring now to FIG. 1B, there is shown an exemplary communication/storage system 100B that employs a trellis-based code. User information 102 that is intended for communication/storage can be encoded by a trellis-based encoder 104 to generate parity information 106. The trellis-based encoder 104 introduces additional information such that parity information 106 includes more bits than user information 102. In some embodiments, a portion of the parity information 106 may include the user information 102, in which case, the encoder is known as a "systematic" encoder. From this point on, for ease of explanation, it will be assumed that in this embodiment, the trellis-based encoder 106 is not a systematic encoder. Therefore, the entire output of the trellis-based encoder 104 will be referred to as parity information 106 or parity bits. However, it is contemplated that the disclosed invention applies to systematic encoders as well.

In the system of FIG. 1B, a modulator 108 configures the parity information 106 into a signal (not shown), which is passed to the channel 110. As used herein, the term "channel" refers to the media, devices, and/or processing stages that occur between a modulator 108 and a detector/demodulator 112 and can correspond to a particular path of media/devices through which a signal can flow, a particular wavelength or time slot which a signal can utilize, and/or another multiple access scheme. For example, in FIG. 1B, the channel 110 can correspond to storage and write and read components of a disk drive, including a magnetic storage medium, a disk-drive read/write head, and other storage system components. In some cases, the term "channel" as used herein can also include the modulator 108 and the demodulator/detector 112. While in the channel 110, the signal may encounter error-producing phenomena, such as device physical failure, device electrical failure, signal interference, and/or data loss due to buffer overflow, for example. The interference signals and other error-producing phenomena in a channel 110 will be referred to herein as "noise." As shown by the description above, the terms channel and noise are more conceptual than physical, but they may correspond to physical aspects of a system. For ease of explanation, it will be assumed that in this embodiment the channel 110 of FIG. 1B is not an ISI channel. However, it is contemplated that channel 110 can include an ISI channel.

With continuing reference to FIG. 1B, the signal on the channel 110 can be received by a demodulator/detector 112. The demodulator/detector 112 can produce detected information 114 based on the received signal. If there are no errors in the detected information 114, the detected information 114 should be the same as the parity information 106. If there are errors, however, modified trace-back Viterbi decoder 116 may be able to correct some or all of the errors by virtue of the maximum-likelihood detection. If the modified trace-back Viterbi decoder 116 is able to correct all of the errors, the decoded information 118 will be the same as the user information 102. Otherwise, the decoded information 118 will be different from the user information 102. In this case, another layer of error-correction coding may be helpful. This error-correction coding may use error event information generated by modified trace-back Viterbi decoder 116, including error event masks and error event metrics, to detect and correct errors. Those skilled in the art will recognize that various modulation/demodulation technologies can be used. Those skilled in the art will recognize that, in one embodiment, the trellis-based encoder 104 and the modulator 108 can be combined in a technology known as "trellis-coded modulation."

In both of the illustrated systems of FIGS. 1A and 1B, detection/decoding operate based on the same concept of computing metrics for each branch of the trellis based on the received signals/bits, and then identifying the path through the trellis that has the lowest cumulative metric. The cumulative metric of a path will be referred to herein as a "path metric." Additionally, the path that has the lowest path metric will be referred to as the "winning path," and the trellis state at the end of the winning path will be referred to as the "winning state." All paths other than the winning path will be referred to as "losing paths."

Figure 4:
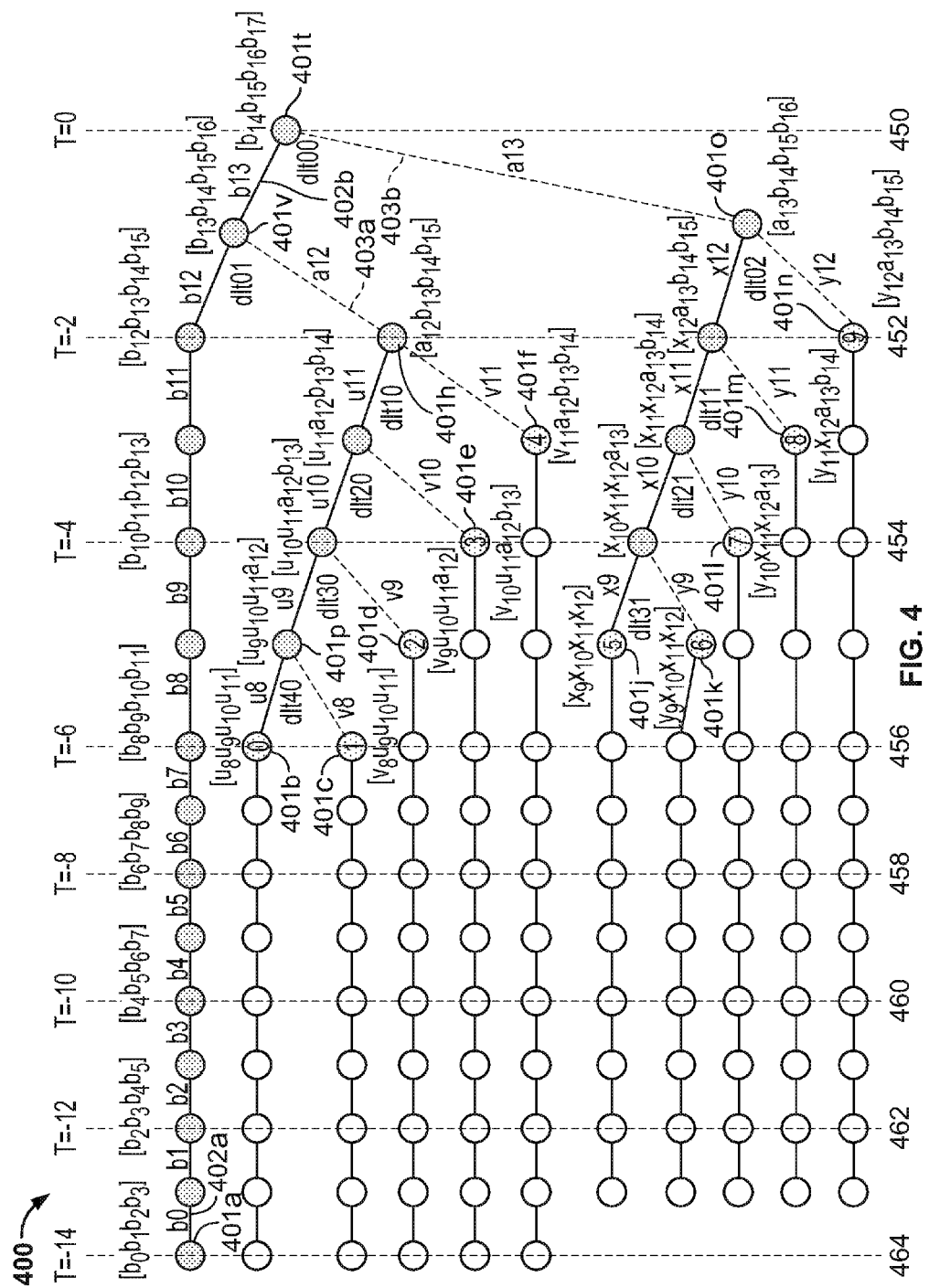
FIG. 4 shows an illustrative trellis diagram including two modified trace-back paths in accordance with some embodiments.

FIG. 4 shows an illustrative trellis diagram 400 including states 401, winning branches 402, and losing branches 403. For each of illustration, only a few of the states 401, the winning branches 402, and the losing branches 403 are given individual reference numbers within FIG. 4 and will be mostly referred to herein by their respective collective reference numbers 401, 402, and 403. Winning branches 402 are indicated by solid lines and the losing branches 403 are indicated by broken lines. Additionally, each state 401 of trellis diagram 400 is associated with a path metric (not shown) for the lowest-metric path leading to that state, i.e., as the winning path to that state. Each branch of trellis diagram 400 is also associated with a "path metric differences" (PMD). The PMD of a branch is defined as the difference between the path metric of that branch and the path metric of a winning branch to the same destination trellis state. PMD is computed on a state by state basis for all of the branches entering a particular state. A winning branch entering a particular state has a PMD of zero, and a losing branch entering that state has a PMD that is the difference between the path metric for that losing branch and the path metric for the winning branch.

Although Viterbi decoding can identify a correct path through a trellis, Viterbi decoding can in some situations produce an incorrect path. In this case, it may be helpful to identify alternate paths and their likelihoods of occurring. An alternate path can be identified by starting at the winning state and then tracing branches back through the trellis.

Figure 3:
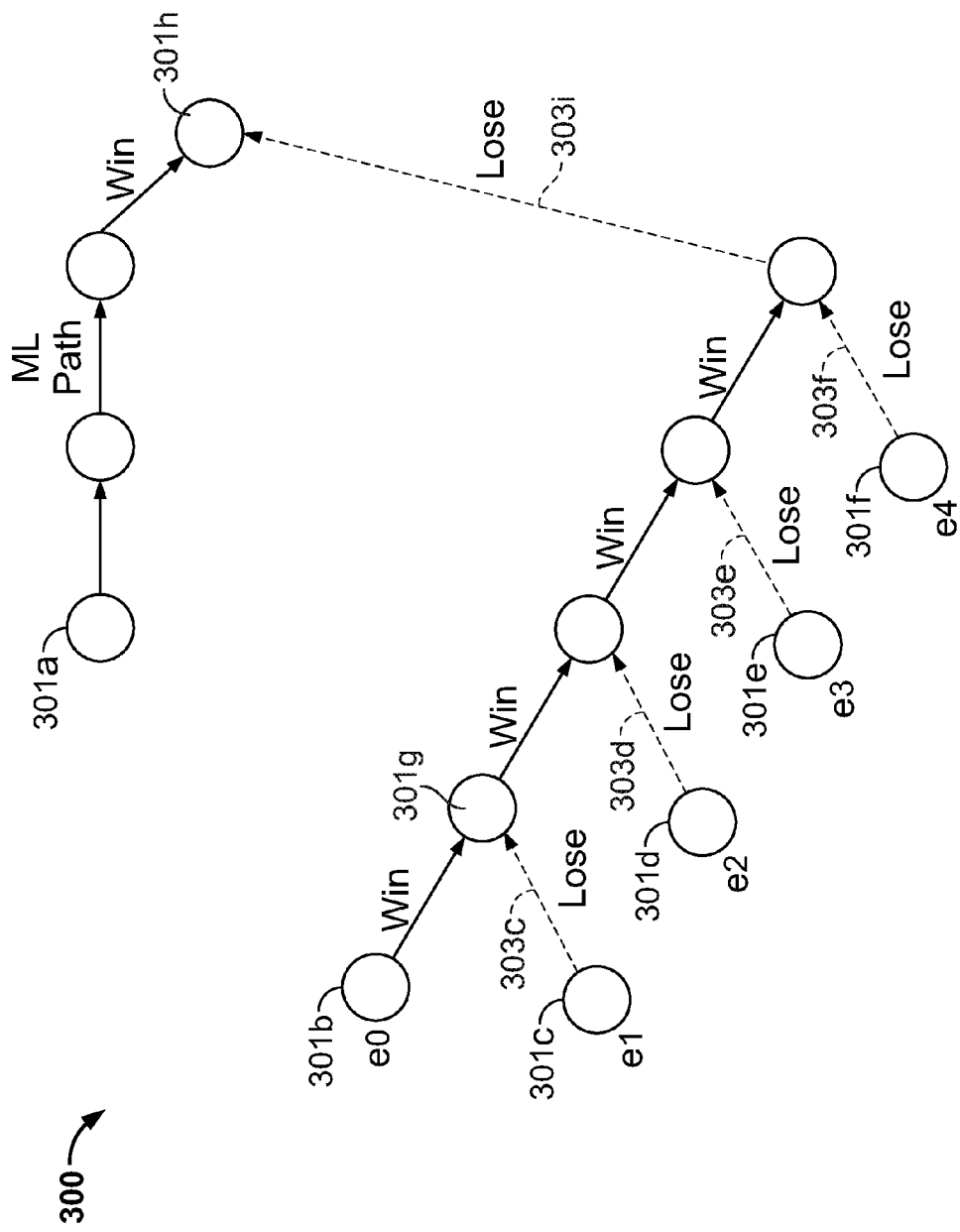
FIG. 3 shows a modified track-back path through a trellis that may be used in accordance with some embodiments.

FIG. 3 shows a modified track-back path 300 through a trellis that may be used in accordance with some embodiments. State 301h is the winning state. The path from state 301a to state 301h is the winning path. Modified trace-back 300 path includes five alternate paths labeled e0 through e4. Alternative path e0 (beginning at state 301b) is the path of winning branches that merges into winning state 301h via losing branch 303i. Alternate paths e1 through e4 (beginning at respective states 301c, 301d, 301e, and 301f) are the paths that merge into alternative path e0.

One advantage of modified trace-back path 300 is that this arrangements allows simple calculations of path metrics. Alternative path e0 only includes one losing branch (303i). Therefore the path metric of alternative path e0 is equal to the PMD of losing branch 303i. Alternative paths e1 through e4 each include two losing branches, losing branch 303i and their respective losing branches 303c, 303d, 303e, and 303f. The path metric of alternative path e1 is equal to the sum of the PMD of losing branch 303i and the PMD of losing branch 303c. The path metrics of alternative paths e2, e3, and e4 can be computed in the same way as alternative path e1 by substituting the PMDs of their respective losing branches.

Modified trace-back path 300 is a depth-four modified trace-back path. In other words, the trace-back includes four stages from winning state 301h to 301g. For ease of explanation, it will be assumed that all of the modified trace-back paths discussed herein are depth-four. However, it is contemplated that the embodiments described herein may be used with any suitable depth of modified trace-back. For example, the depth of trace-back may be increased to increase the number of identified alternative paths or may be decreased to reduce the number of alternative paths.

Returning to FIG. 4, it can be seen that trellis 400 includes two modified trace-back paths. The upper trace-back path includes alternative paths 0 though 4, beginning at respective states 401b, 401c, 401d, 401e, and 401f and ending at state 401h. The lower trace-back path includes alternative paths 5 though 9, beginning at respective states 401j, 401k, 401l, 401m, and 401n and ending at state 401o. The relationship between these two modified trace back paths will be discussed in greater detail below. The modified trace-back paths of trellis 400 defines a trace-back portion of the trellis. Within the trace-back portion of trellis 400 both winning branches 402 and losing branches 403 are shown. In the non-trace-back portion of trellis 400 only the winning branches 402 are shown. Within trellis 400, the trace-back portion covers the time period beginning at time 450 and ending at time 456 and the non-trace-back portion covers the time periods earlier than time 456.

Each of the alternate paths within trellis 400 corresponds to user information, which can be identified by taking the user bits associated with the path branches. The winning paths also corresponds to user information. The user bits for the winning paths can be compared to the user bits for the alternate paths to generate error patterns. For example, suppose the winning path corresponds to user bits "0011011" and an alternate path corresponds to user bits "0111101" These user bit sequences can be compared to form an error pattern in which locations of the bit differences are shown by a "1" symbol, and the locations having the same bits are shown by a "0" symbol. Accordingly, for the example above, the error pattern, referred to herein as an "error event mask," is "0100110." A straightforward XOR operation can be used to generate the error event masks.

Alternate paths and their corresponding error event masks can be associated with likelihood values, referred to herein as "error event metrics." The error event metric of an alternative path may be equal to the path metric of that alternative path. An approach for calculating the path metrics for the alternative paths in a modified trace-back path is described above, with respect to FIG. 3. The error event metrics for different alternate paths/error event masks can be compared to determine which error event masks correspond to more likely errors. More likely errors are associated with smaller error event metric values.

Figure 2:
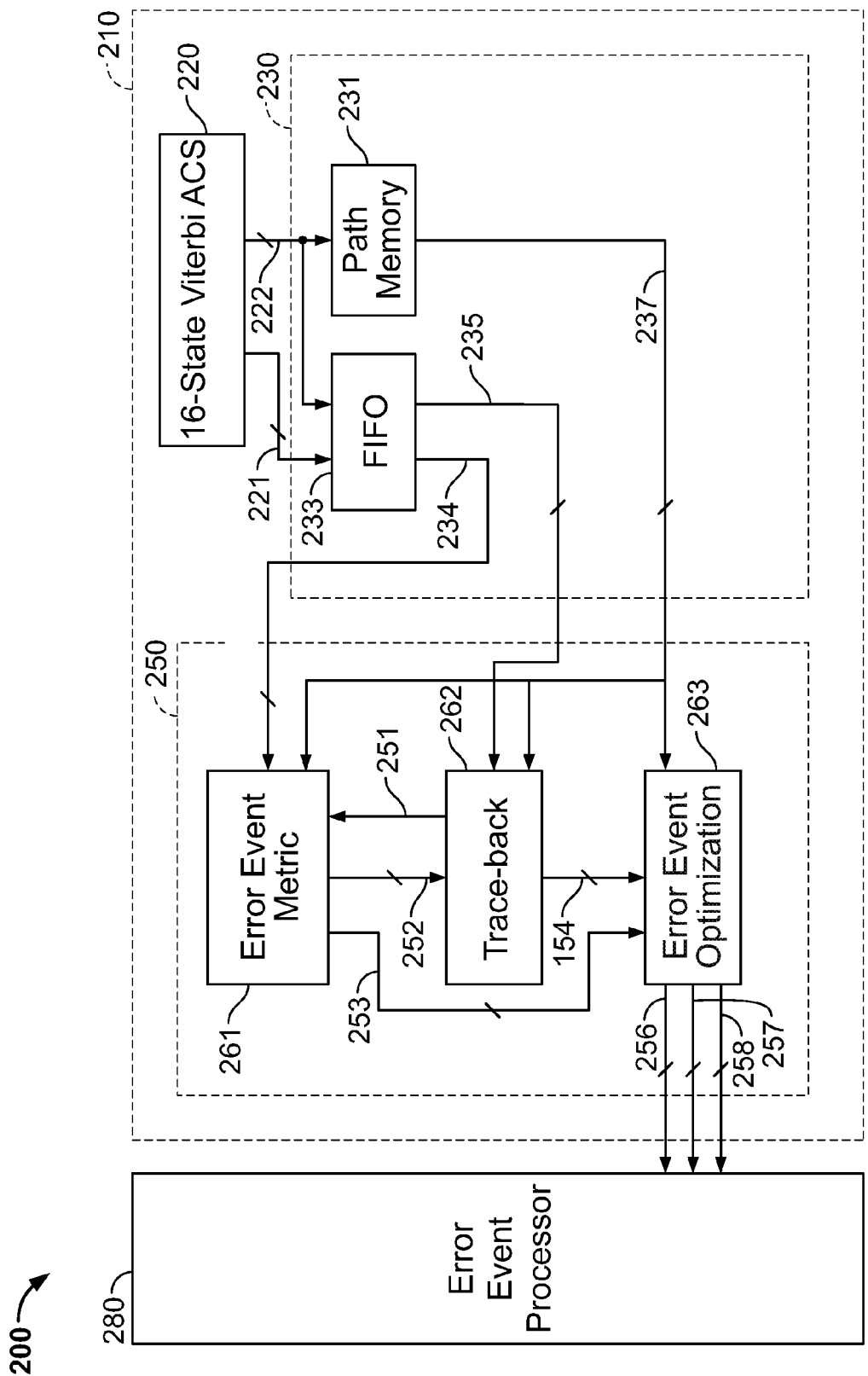
FIG. 2 is a block diagram of a portion of a modified traceback Viterbi detector/decoder in accordance with some embodiments.

FIG. 2 shows a simplified block diagram of a portion of a modified trace-back Viterbi detector/decoder 210 (referred to hereafter as modified trace-back Viterbi decoder 210) in accordance with some embodiments. The elements of modified trace-back Viterbi decoder 210 may be incorporated into modified trace-back Viterbi detector 124 of FIG. 1A or modified trace-back Viterbi decoder 116 of FIG. 1B. For ease of illustration, modified trace-back Viterbi decoder 210 does not include all of the elements of a Viterbi detector/decoder. Instead, only the portions of modified trace-back Viterbi decoder 210 that are used to generate soft reliability information are shown. For example, a maximum likelihood detector is not shown.

The illustrated portion of modified trace-back Viterbi decoder 210 include a 16-state Viterbi add-compare-select (ACS) circuit 220, a delay circuit 230, and an error event generation circuit 250. Modified trace-back Viterbi decoder 210 operates using a dual-bit architecture that processes two bits of information every clock cycle. As used herein, the first bit and its associated information will referred to as "target information" and the second bit and its associated information will referred to as "virtual information." ACS circuit 220 is a 16-state Viterbi circuit that outputs decoded bits corresponding to a determined winning path through the trellis. ACS circuit 220 also outputs PMD values for each decoded bit. In the illustrated embodiment, ACS circuit 220 outputs 32 decision bits and 32 6-bit PMDs every clock cycle (i.e., a 16 bit output corresponding to the winning path and 16 PMDs for each of the two bits processed during the profile). These two outputs are shown as 32 bit decision signal 222 and 192 bit PMD signal 221. It should be understood that these bit lengths are merely illustrative. For example, the Viterbi detector may have any suitable number of states or the PMD data may be represented by any suitable number of bits.

Decision signal 222 and PMD signal 221 are provided to delay circuit 230. Delay circuit 230 includes path memory (PM) circuit 231 and FIFO 233. PM circuit 231 receives 32 bit decision signal 222 from ACS circuit 220 and outputs the two data bits 237. The two data bits 237, also known as the target bit and the virtual bit, represent the two consecutive winning states of the trellis for a given clock cycle. FIFO 233 receives decision signal 222 and PMD signal 221 from ACS circuit 220. FIFO 233 delays them to align with the output of PM circuit 231. FIFO 233 outputs the PMD values as PMD signal 234, aligned with data bits 237. FIFO 233 outputs decision signal 222 as TDA/VDA signal 235. The TDA signal portion represents the decisions of ACS circuit 220 for the target bit. The VDA signal portion represents the decisions of ACS circuit 220 for the virtual bit. Both portions of TDA/VDA signal 235 have 16 bits corresponding to the respective decisions of the 16 Viterbi states. TDA/VDA signal 235 is aligned with both data bits 237 and PMD signal 234.

PMD signal 234, TDA/VDA signal 235, and data bits 237 are all provided to error event generation circuit 250. Error event generation circuit 250 includes error event metric circuit 261, trace-back circuit 262, and error event optimization circuit 263. Trace-back circuit 262 uses TDA/VDA signal 235 and data bits 237 to generate error event masks. In some embodiments, trace-back circuit 262 generates error event masks for all identified alternate paths. In the illustrated embodiment, trace-back circuit 262 generates error event masks for the most likely error events as identified by error event metric circuit 261. Trace-back circuit 262 may receive information about the selection of error events using, for example, signal 252. Trace-back circuit 262 outputs error event mask signal 254 to error event optimization circuit 263. In the illustrated embodiment, error event mask signal 254 includes six 13-bit error event masks (three error event masks for each target bit and three error masks for each virtual bit). The operation of trace-back circuit 262 will be described in greater detail below with respect to FIGS. 4-7.

Error event metric circuit 261 uses PMD signal 234, data bits 237 and state index information, signal 251, from Trace-back circuit 262 to generate error event metrics. In some embodiments, error event metric circuit 261 generates error event metrics for all identified alternate paths. In the illustrated embodiment, error event metric circuit 261 generates error event metrics for the most likely error events. Error event metric circuit 261 outputs error event metric signal 253 to error event optimization circuit 263. In the illustrated embodiment, error event metric signal 253 includes six 6-bit event metrics (three error event metrics for each target bit and three error event metrics for each virtual bit). The operation of error event metric circuit 261 and the selection of most likely error events will be described in greater detail below with respect to FIGS. 4, 8, and 11.

Error event optimization circuit 263 receives data bits 237, error event mask signal 254, and error event metric signal 253. Error event optimization circuit 263 reduces the bit-length of error event mask signal 254 and error event metric signal 253 and outputs them as reduced error event mask signal 257 and reduced error event metric signal 258, respectively, aligned with data bits 256 to error event processor 280. In the illustrated embodiment, reduced error event mask signal 257 includes six 8-bit error event masks and reduced error event metric signal 258 includes six 5-bit error event metrics. The operation of error event optimization circuit 263 will be described in greater detail below with respect to FIGS. 9 and 12. An illustrative method describing the operation of modified trace-back Viterbi decoder 210 will be described in greater detail below with respect to FIG. 10.

The operation of an illustrative error event processor is described in U.S. patent application Ser. No. 12/572,503, entitled "ERROR EVENT PROCESSING METHODS AND SYSTEMS", and filed concurrently herewith. The disclosure of this application is hereby incorporated by reference in its entirety.

Returning to FIG. 4, trellis 400 is a portion of a 16-state Viterbi trellis that may be used to illustrate trace-back and error event generation, using the modified trace-back path described above in FIG. 3 using the dual-bit architecture described above in FIG. 2. At a current time (T=0), indicated by line 450, the target bit is represented by state 401t and the virtual bit is represented by state 401v. The portion of the winning path illustrated in trellis 400 begins at state 401a and proceeds along the top of trellis 400 through state 401v (virtual bit) and ends at state 401t (target bit). The values (i.e., b0, b1, b2, etc.) associated with each of the winning branches 402 of the winning path represent the respective bit values associated with each branch. The bracketed values (i.e., [b0b1b2b3], [b2b3b4b5], etc.) associated with each state 401 of the winning path represent an index of each state. (It is noted that for the sake of clarity in the illustration branch bit values and state index values are not shown for every state in trellis 400.)

Modified trace-back paths are shown in trellis 400 for both the target bit and the virtual bit. The modified trace-back path for the target bit (also referred to herein as the "lower modified trace-back path") traces back from state 401t to each of states 401j, 401k, 401l, 401m, and 401n using the approach described above in FIG. 3. These trace-back paths are also referred to herein as alternate paths 5, 6, 7, 8, and 9, respectively. The modified trace-back path for the virtual bit (also referred to herein as the "upper modified trace-back path") traces back from state 401v to each of states 401b, 401c, 401d, 401e, and 401f using the approach described above in FIG. 3. These trace-back paths are also referred to herein as alternate paths 0, 1, 2, 3, and 4, respectively. As with the winning path, the branches of the alternate paths are associated with branch bit values and state index values. The branch bit values and state index values are known for the winning path (i.e., the "b" values—b0, b1, etc.) and may be determined from ACS the decision values (e.g., TDA/VDA signal 235 of FIG. 2). A few of the branch bit values and state index values are known for the alternate paths. For example, state 401o is the state that merges into target bit state 401t from losing branch 403b. Because the branch bit value of the winning branch into target bit state 401t is known, the branch bit value of the losing branch into target bit state 401t is also known. The branch bit value of the losing branch into target bit state 401t will be the opposite of the branch bit value of the winning branch into target bit state 401t. The branch bit values and corresponding state index values that can be derived from the known "b" values are represented within trellis 400 as "a" values (e.g., a12 and a13).

The remaining branch bit values and state index values need to be determined by tracing-back through trellis 400 and are referred to herein as unknown values. The unknown values for upper modified trace-back path are represented by "u" values (e.g., u8, u9, etc.) and "v" values (e.g., v8, v9, etc.). The "u" values correspond to winning branches 402 and the "v" values correspond to losing branches 403. For example, branch u8 is the winning branch that enters state 401p and branch v8 is the losing branch that enters state 401p. Because of this relationship, "u" values and "v" values are opposites. Similarly, unknown values for lower modified trace-back path are represented by "x" values (e.g., x9, x10, etc.) and "y" values (e.g., y9, y10, etc.). The "x" values and "y" values are also opposites.

Additionally, FIG. 4 shows the PMD values associated with both of the modified trace-back paths within trellis 400. As described above the PMD of a losing branch entering a state is equal to the difference between the path metric for that losing branch and the path metric for the winning branch entering state. For example, the PMD of losing branch 403b is equal to difference of the path metric of losing branch 403b and winning branch 402b. The PMD of losing branch 403b is represented by the symbol "dlt00." As described above with respect to FIG. 3, the error event metrics of the alternate paths within the modified trace-back path is calculated by summing the PMDs of each path. Table 1 lists all of the alternate paths within both of the modified trace-back paths within trellis 400 and their associated error event metric calculations.

TABLE 1

| Alternate Path # | Error Event Metric |
| --- | --- |
| 0 | dlt01 |
| 1 | dlt01 + dlt40 |
| 2 | dlt01 + dlt30 |
| 3 | dlt01 + dlt20 |
| 4 | dlt01 + dlt10 |
| 5 | dlt00 |
| 6 | dlt00 + dlt31 |
| 7 | dlt00 + dlt21 |
| 8 | dlt00 + dlt11 |
| 9 | dlt00 + dlt02 |

PMD value, dlt00, associated with the losing branch entering into state 401t (associated with the target bit) and PMD value, dlt01, associated with the losing branch entering into state 401v (associated with the virtual bit) are both known and may be determined from ACS derived PMD values (e.g., PMD signal 234 of FIG. 2). The remaining PMD values may be calculated by tracing back through trellis 400.

Figure 5:
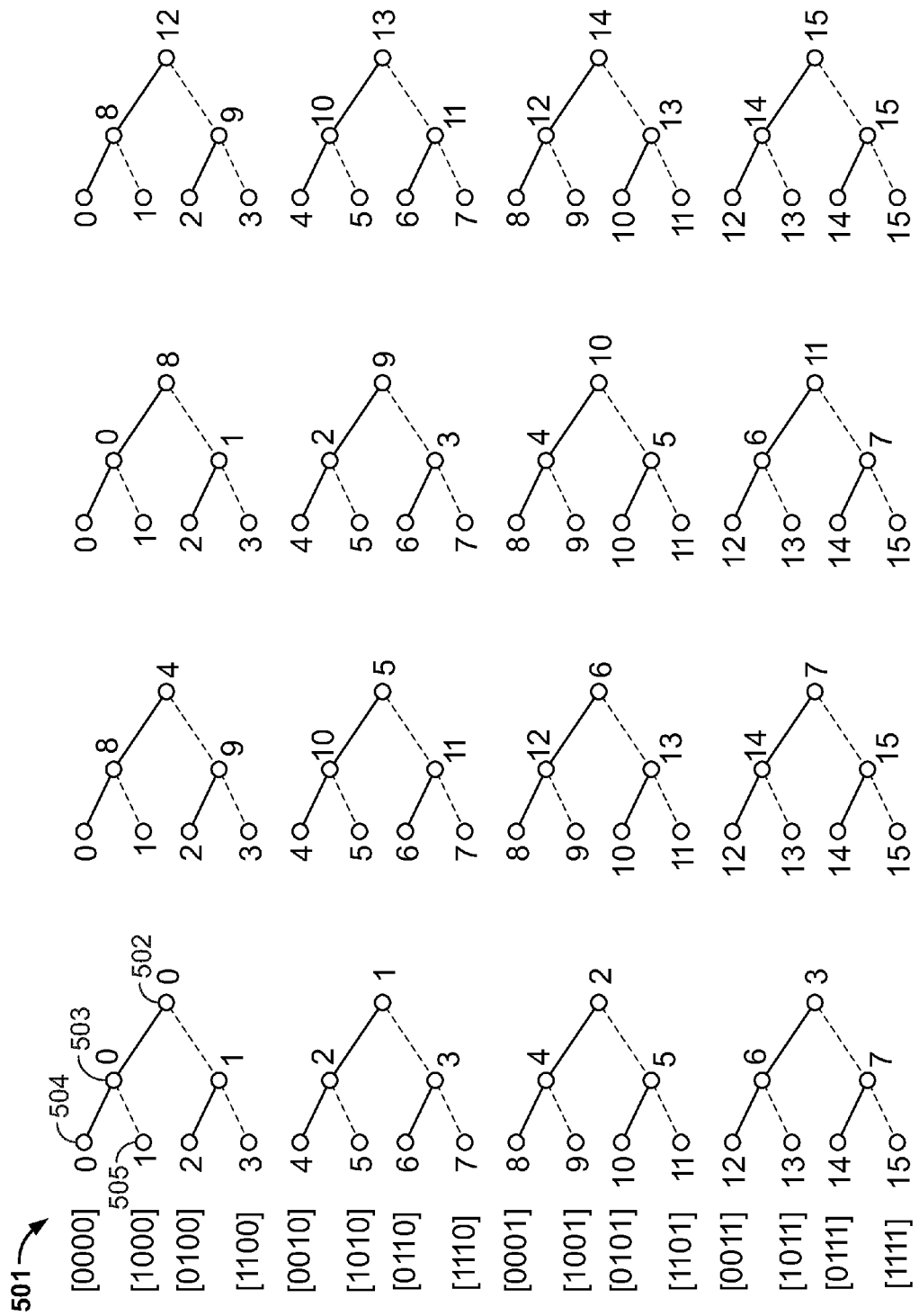
FIG. 5 shows a series of trellis segments associated with a 16-state Viterbi trellis in accordance with some embodiments.

In accordance with some embodiments, the relationship between the target bits and the virtual bits may simplify the process of tracing back through trellis 400 in order to determine error events. This relationship between target bits and virtual bits is illustrated with respect to FIG. 5. FIG. 5 shows a series of trellis segments associated with a 16-state Viterbi trellis such as trellis 400 of FIG. 4. These segments represent all of the possible transitions within the trellis. In trellis segment 501, the value of the final state 502 is 0. In a single-bit architecture, it is unknown whether the preceding state was 0 or 1 and it is therefore also unknown whether the initial state of the segment was 0, 1, 2, or 3. In contrast, using a dual-bit architecture, the target bit (i.e., 0) is known and the virtual bit is also known. Therefore if the value of the virtual bit is also 0, which is associated with state 503, it is known that the preceding state must be 0 or 1 and cannot be 2 or 3. As will be described in greater detail below, this relationship between the target and virtual bits may be used to simplify the determination of error events.

Figure 6:
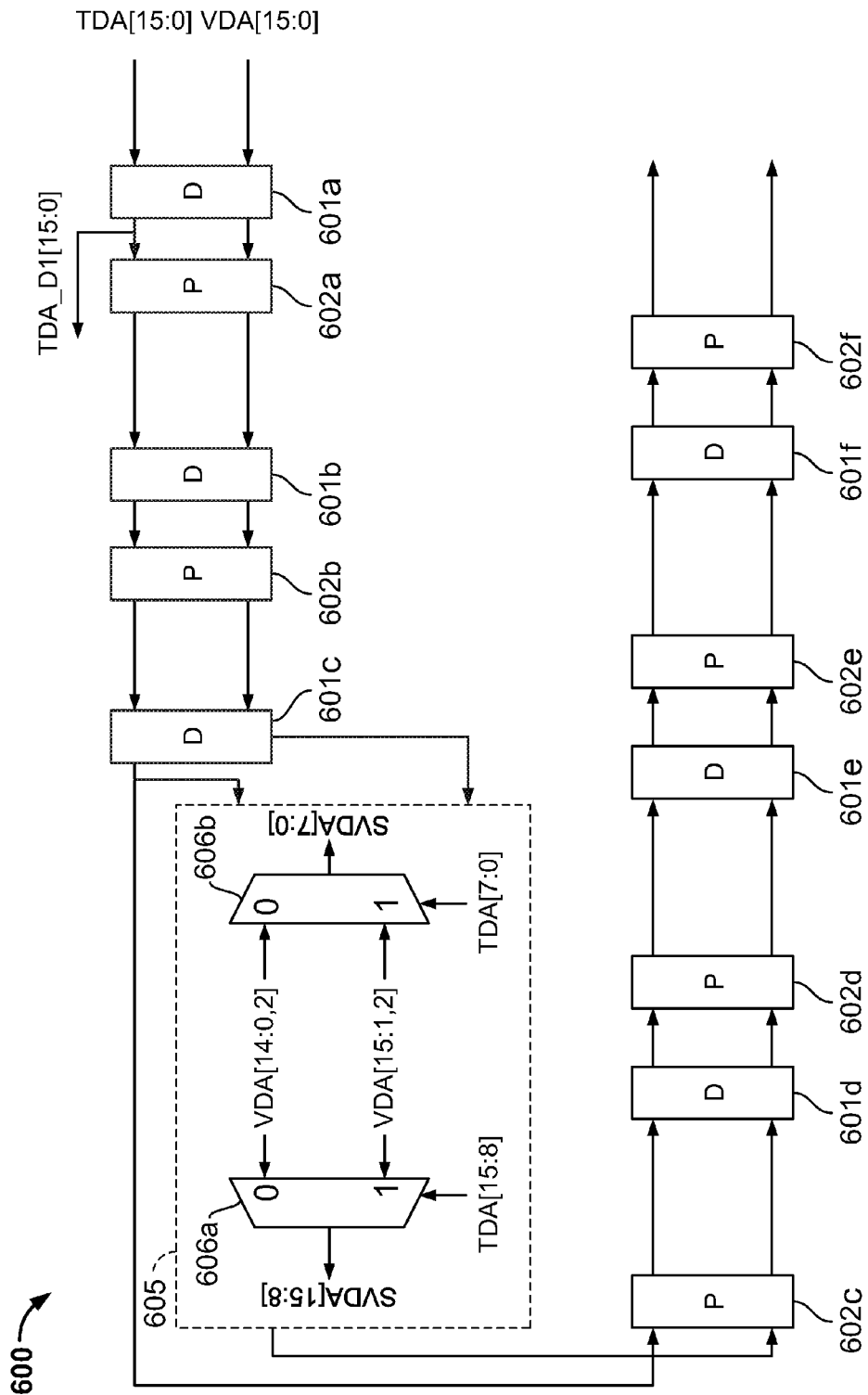
FIG. 6 shows an illustrative delay line for ACS decision bits used to generate error event masks in accordance with some embodiments.

FIG. 6 shows an illustrative delay line 600 for ACS decision bits (e.g., TDA/VDA signal 235 of FIG. 2). This delay line may be used within a trace-back circuit (e.g., trace-back circuit 262 of FIG. 2) to generate error event masks. Delay line 600 includes a series of paired delay stages 601 and pipeline stages 602. Both delay stages 601 and pipeline stages 602 delay the ACS decision bits by one clock cycle. For example, the input signals (TDA/VDA) are received with no delay (T=0). After passing through delay stage 601a and pipeline stage 602a, the signals have been delayed by two clock cycles (T=−2). As the signals proceed through the series of paired delay stages 601 and pipeline stages 602, they are delayed further. After the final stage, delay stage 601f and pipeline stage 602f, the signal is delayed by twelve clock cycles (T=−12). These delay times correspond to the times listed on FIG. 4. Trellis diagram 400 of FIG. 4 illustrates the equivalent trace-back location of each stage of delay line 600.

In between delay stage 601c and pipeline stage 602c is TDA/VDA multiplexing unit 605. TDA/VDA multiplexing unit 605 is based on the relationship between the target and virtual bits described above with respect to FIG. 5. The TDA decision bits are input to multiplexers 606 in order to control which of the VDA decision bits are output from multiplexers 606. For example, if bit 0 of the TDA signal is 1, bit 1 of the VDA signal will be output. If instead bit 0 of the TDA signal is 0, bit 0 of the VDA signal will be output. This output of TDA/VDA multiplexing unit 605, SVDA, a modified virtual bit signal, replaces the VDA signal for the remaining stages of delay line 600. The advantage of replacing VDA with SVDA is that from this point onwards the same state indexes can be used to determine user bits associated with both virtual and target bits. For example with reference to FIG. 4, [u10u11a12b13] can be used as state index to determine both u8 and u9. Otherwise, additional state index [u9u10u11a12] would be used to determine u8.

Figure 7:
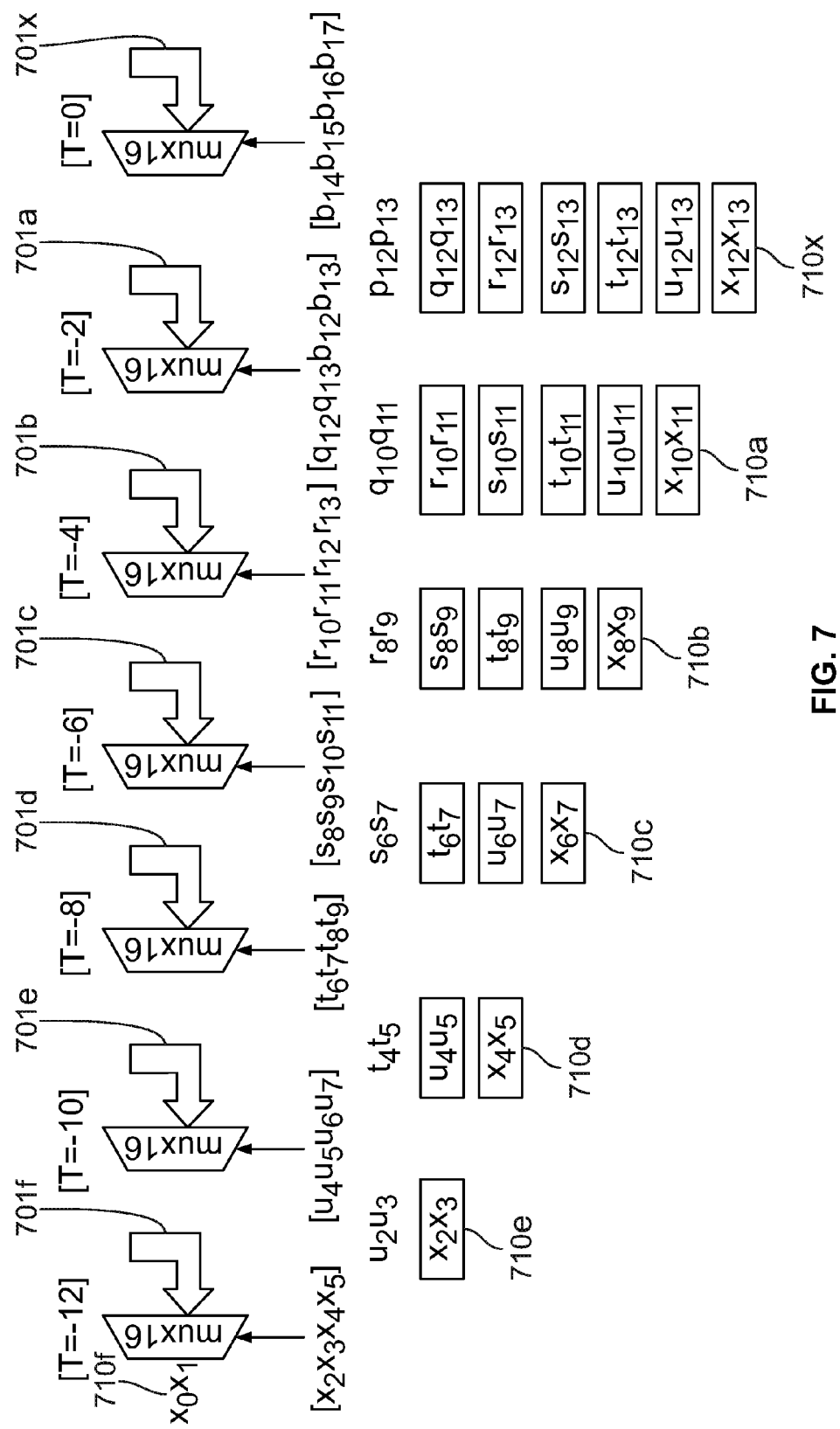
FIG. 7 shows an illustrative pipeline stages used to generate error event masks in accordance with some embodiments.

The operation of pipeline stages 602 is illustrated with reference to FIG. 7. At each pipeline stage 602 (FIG. 6), the corresponding TDA/VDA signal is input to a 16-bit multiplexer 701 (FIG. 7). For example, at pipeline stage 701a the T=−2 delayed TDA/VDA signal is input to 16-bit multiplexer 701a. Control bits for multiplexers 701 are generated from data bits and TDA/VDA signal. For 16-bit multiplexer 701x, the control bits [b14b15b16b17] are the data bits as shown in FIG. 4. Basically the control bits for each 16-bit multiplexer 701 are index of a corresponding trellis state. For 16-bit multiplexer 701a, the control bits are one-cycle delayed output, q12 and q13, of 16-bit multiplexer 701x and data bits, b12 and b13. Data bits b12 and b13 are one-clock cycle delayed version of data bits b14 and b15, respectively. b12 and b13 are using in this stage because in this stage q12 and q13 are used in place of p12 and p13. q12 and q13 are one-cycle delayed versions of p12 and p13, which are the direct outputs of 16-bit multiplexer 701x. Output stacks 710 show the respective outputs of 16-bit multiplexers 710, with the newest output being on top of the stack. For example, output stack 710b corresponds to the output of 16-bit multiplexer 701b. The combined output of 16-bit multiplexers 710 after TDA/VDA signal (as delayed and altered by delay line 600 of FIG. 6) propagates through all of the pipeline stages is $x_0 x_1 x_2 x_3 x_4 x_5 x_6 x_7 x_8 x_9 x_{10} x_{11} x_{12}$. This output is an alternate state. Referring to FIG. 4, this particular description applies to paths associated with lower modified trace-back path. But same is also true for paths associated with upper modified track-back. Error event masks are generated by performing an XOR operation between x0x1x2x3x4x5x6x7x8x9x10x11x12 and corresponding data bits, "b"s. For paths associated with target bits, an XOR operation is performed with b1b2b3b4b5b6b7b8b9b10b11b12b13. For paths associated with virtual bits, an XOR operation is performed with b0b1b2b3b4b5b6b7b8b9b10b11b12. An error event mask can be generated from the output pipeline stages by performing an XOR operation between the output and the ACS decision bits.

Figure 8:
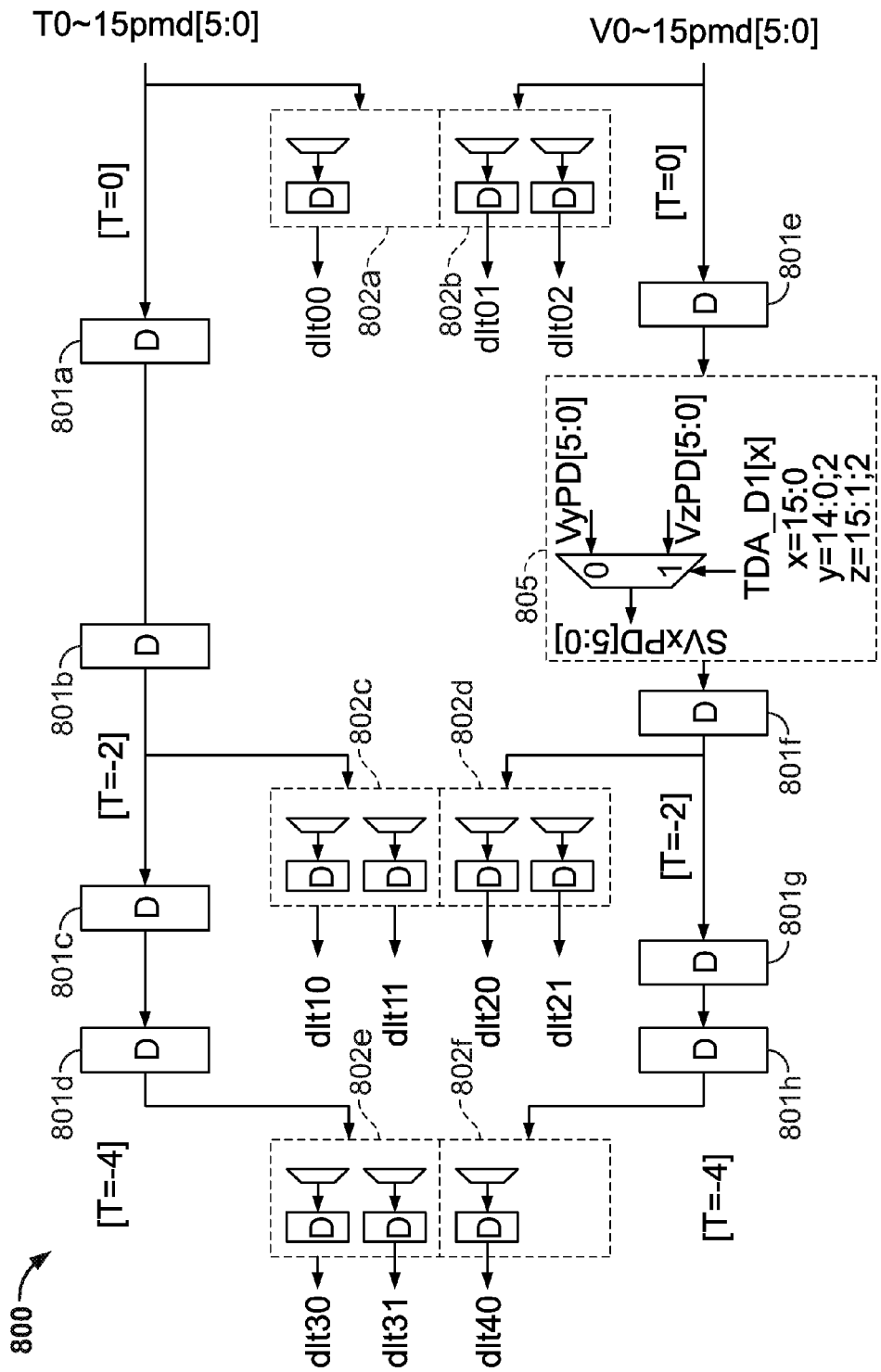
FIG. 8 shows a PMD calculation circuit used to generate error event metrics in accordance with some embodiments.

FIG. 8 illustrates PMD calculation circuit 800.

PMD calculation circuit 800 may be used within an error event metric circuit (e.g., error event metric circuit 261 of FIG. 2). PMD calculation circuit 800 receives as input the PMD values from an ACS circuit (e.g., ACS circuit 220 of FIG. 2). In the illustrated embodiment, 16 target bit PMD values and 16 virtual bit target bit values, each being 6 bits long, are received by PMD calculation circuit 800. The first PMD values dlt00, dlt01, and dlt02 may be determined directly from the PMD input signals using respective multiplexer circuitry 802a, 802b, and 802c. Optional delay blocks are shown within multiplexer circuitry 802, but may be omitted in accordance with some embodiments leaving only multiplexers within multiplexer circuitry 802. The control bits for multiplexer circuitry 802 are data bits (i.e., data bits "b" as shown in FIG. 4) The PMD values calculated by PMD calculation circuit 800 may correspond to the PMD values shown in trellis 400 of FIG. 4. The remaining PMD values (dlt10, dlt11, dlt20, dlt21, dlt30, dlt31, and dlt40) may be determined from the PMD input signals after the PMD input signals are delayed using delay stages 801. In addition, multiplexing unit 805 (operating in a similar manner as TDA/VDA multiplexing unit 605 of FIG. 6) uses a delayed version of the target ACS decision bits (e.g., signal TDA_D1[15:0] output by delay line 600) to modify the order of the virtual bit PMD values. The advantage of this reordering of the PMD values is that from this point onwards separate state indexes are not required to determine PMD values associated with virtual and target bits. For example, with reference to FIG. 4, [u10u11a12b13] can be used as the state index to determine both dlt40 and dlt30. Otherwise, [u9u10u11a12] additional state index [u9u10u11a12] would be used to determine dlt40 After all of the PMD values are determined by PMD calculation circuit 800, error event metric may be computed as described above in Table 1.

Figure 9:
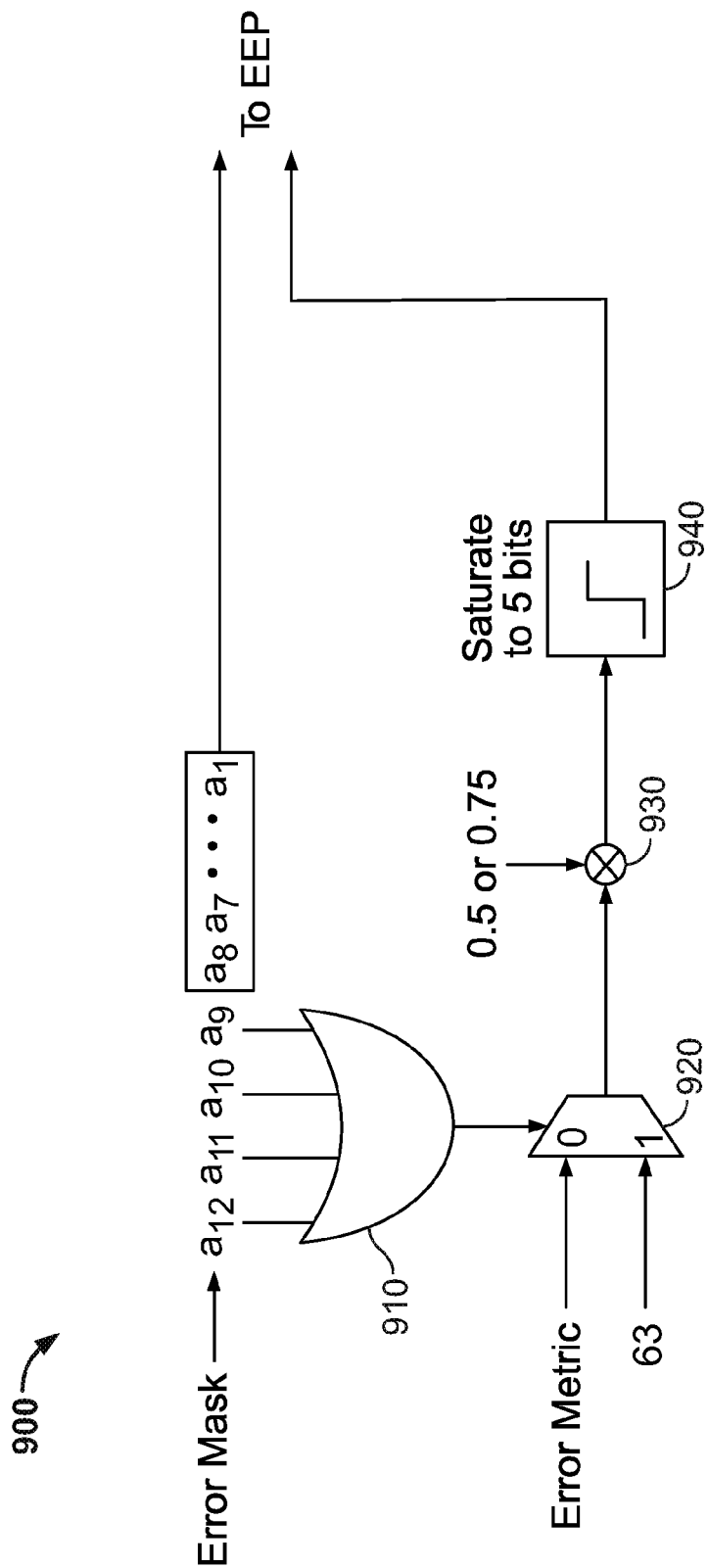
FIG. 9 shows an illustrative block diagram of a portion of error event optimization circuitry in accordance with some embodiments.

FIG. 9 shows an illustrative block diagram of a portion of error event optimization circuitry 900. Error event optimization circuitry may be the same as or similar to error event optimization circuitry 263 of FIG. 2. Error event optimization circuit 900 receives error event masks and associated error event metrics and then outputs these error event values with a reduced number of bits. In the illustrated embodiment, error event optimization circuit receives 13-bit error event masks and outputs 8-bit error event masks. The first bit of all of the error event masks is always one, because the first trace-back stage follows the losing path from the winning state. Therefore the first bit of the error event masks can be dropped. Further, in many cases the error event mask is short, i.e., there are no errors indicated in the final bits of the error event mask. This is represented in FIG. 9 by the final four bits of the error event mask—$a_{12}$, $a_{11}$, $a_{10}$, and $a_9$. When the error event mask is less than nine bits in length, these final four bits (i.e., bits 9 through 12) may be dropped. If there are errors in the final four bits (i.e., if at least one of the bits is equal to one), the error event metric for this error event may be saturated to a maximum value using OR gate 910 and multiplexer 920. Scaler 930 scales the error event metric by a constant value such as 0.5 or 0.75. The scaled error event metric is then saturated by saturation circuit 940 to five bits. In this manner, the error event metric may be reduced from a 6-bit error event metric input to a 5-bit error event metric output.

Figure 10:
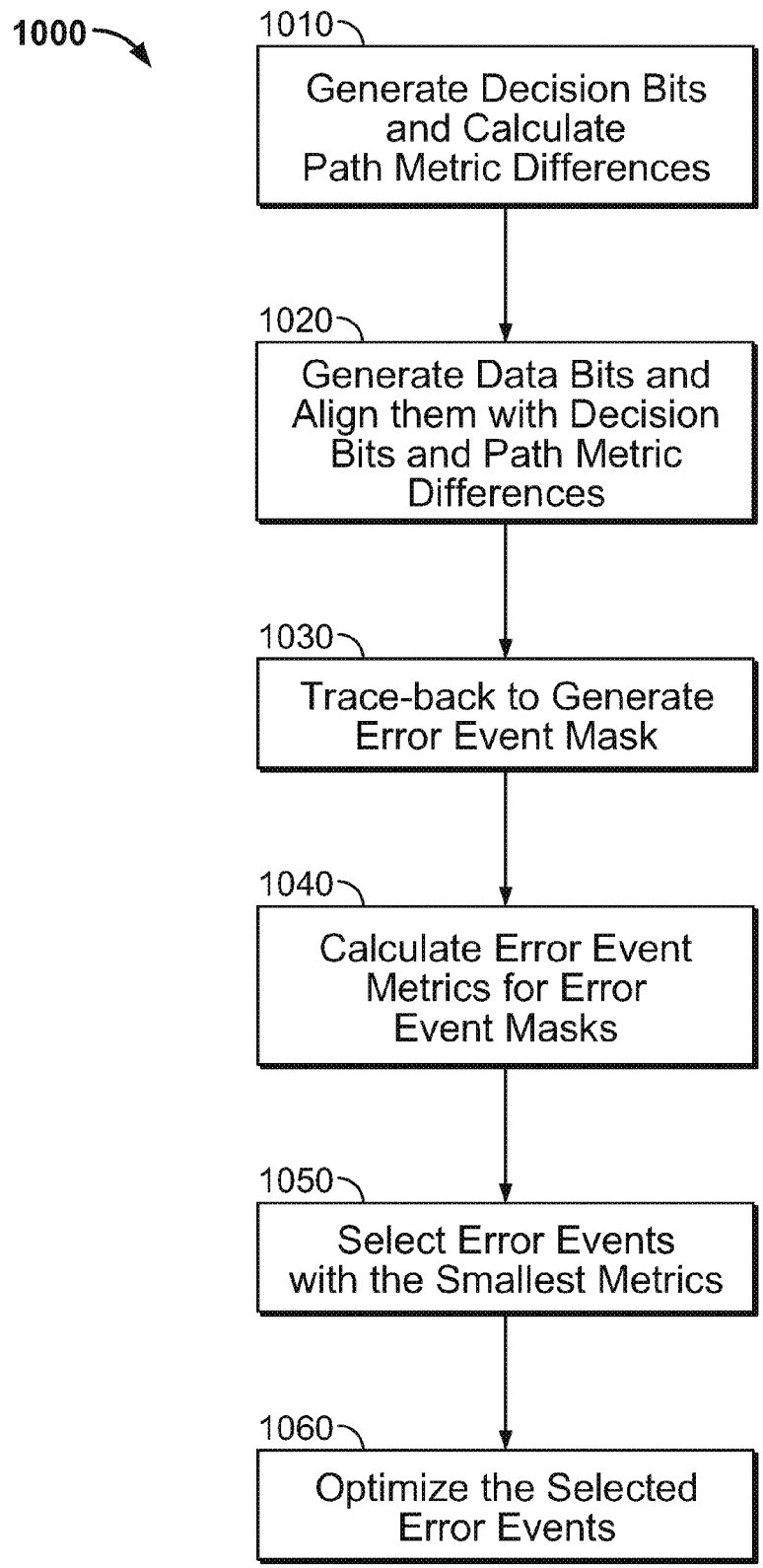
FIG. 10 shows a flow diagram of a method for generating error events in accordance with some embodiments.
Figure 11:
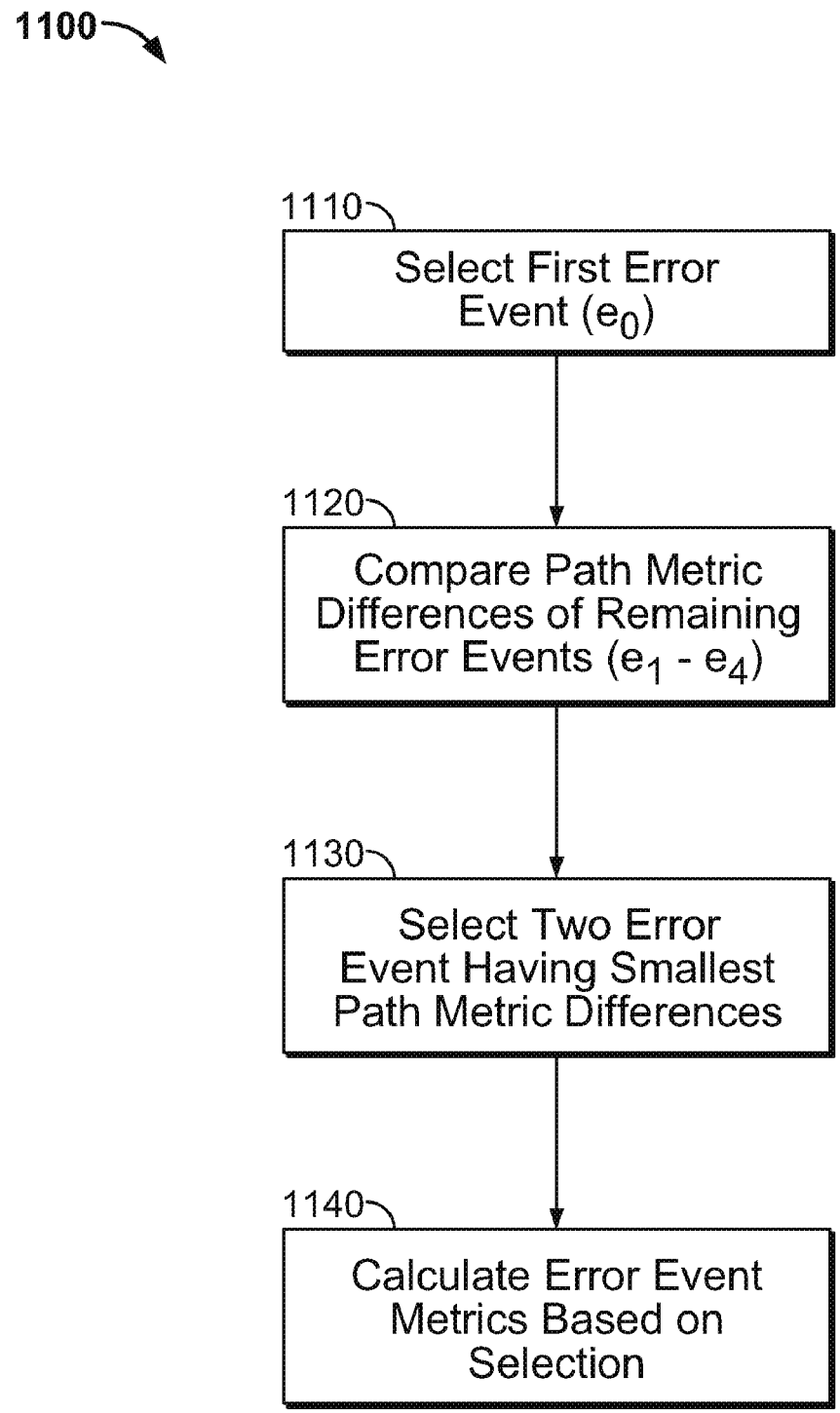
FIG. 11 shows a flow diagram of a method for selecting error events in accordance with some embodiments.
Figure 12:
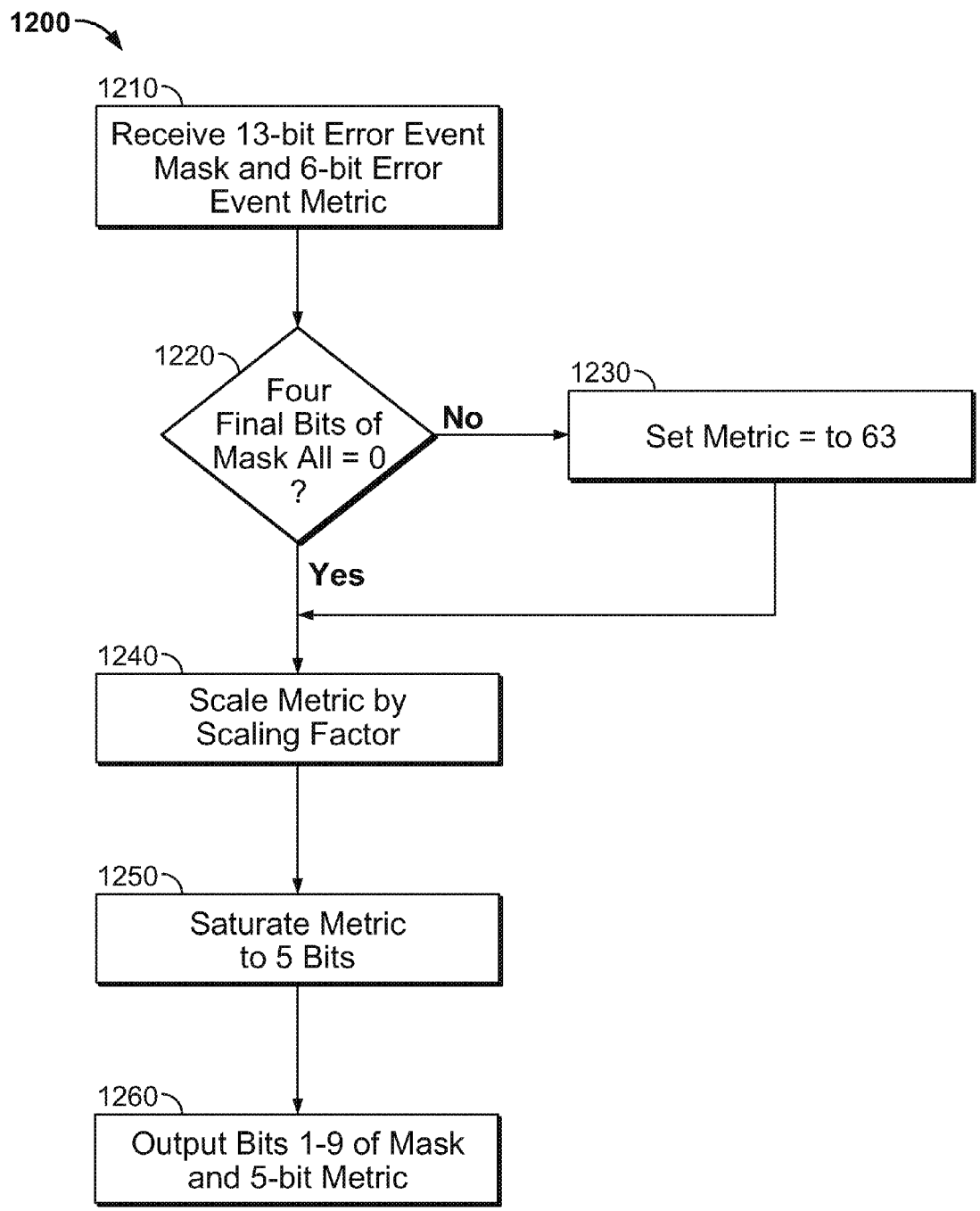
FIG. 12 shows a flow diagram of a method for optimizing generating error events by reducing their bit count in accordance with some embodiments.

FIGS. 10-12 show illustrative flow diagrams of methods for generating error events for decoded bits using the SOVA circuitry and the trace-back approaches described above. FIG. 10 shows flow diagram 1000 of a method for generating error events. At 1010, decision bits are generated and path metric differences are calculated. For example, 1010 may be performed by 16-State Viterbi ACS circuit 220 of FIG. 2. At 1020, the data bits are generated from decision bits and aligned with decision bits and path metric differences (e.g., using delay circuit 230 of FIG. 2). At 1030, trace-back is performed to generate error event mask (e.g., using trace-back circuit 262 of FIG. 2). This trace-back may follow the modified trace-back path illustrated in FIG. 3 using the techniques described above in FIG. 4, FIG. 6, and FIG. 7. At 1040, error event metrics are calculated for error event masks (e.g., using error event metric circuit 262 of FIG. 2). This calculation may be performed by adding the path metric differences determined according to the techniques described above in FIG. 8. At 1050, the error events with the smallest metrics are selected (e.g., using error event metric circuit 262 of FIG. 2). An illustrative method for selecting the smallest error event metrics is illustrated in the flow diagram of FIG. 11. At 1060, the selected error event may be optimized. For example, error event optimization circuit 263 of FIG. 2 and error event optimization circuit 900 of FIG. 9 reduce the number of bits in the error event masks and error event metrics. An illustrative method for reducing the number of bits in the error event masks and error event metrics is illustrated in the flow diagram of FIG. 12.

FIG. 11 shows flow diagram 1100 of a method for selecting error events. As described above with respect to FIG. 3, the modified trace-back path provides five alternate paths each associated with an error event mask and error event metric. In the present embodiment, the three error events with the lowest error event metrics are selected. At 1110, the first error event e0 (corresponding to alternate path 0) is selected. As discussed above, this alternate path passes through only one losing branch while all other alternate paths pass through the same losing branch as alternate path 0 in addition to a second losing branch. At 1120, the path metric differences of the remaining error events (e1 through e4) are compared. At 1130, the two error events having the smallest path metric differences are selected. At 1140, error event metrics are calculated based on the selection. The error event calculation is described above with respect to Table 1.

FIG. 12 shows a flow diagram 1200 of a method for optimizing generating error events by reducing their bit count. At 1210, an error event is received having a 13-bit error event mask and a 6-bit error event metric. At 1220, it is determined whether the four final bits of the error event mask are all equal to zero. If the four final bits of the error event mask are equal to zero, the error event is used. At 1240, the error event metric is scaled by a scaling factor. At 1250, the error event metric is saturated to five bits. At 1260, bits 1-9 of the error event mask is output with the 5-bit error event metric. Bit 0 of the error event mask can be omitted because it is known to by equal to 1. If the four final bits of the error event mask are not equal to zero, the error event mask will not be used. At 1230, the error event metric will be set to the maximum value, 63.

Accordingly, what have been described thus far are systems and methods for identifying potential error events in connection with trellis-based detection/decoding. The disclosed technology also produces soft information for detected/decoded bits. The disclosed circuits, components, and methods can be implemented using means such as digital circuitry, analog circuitry, and/or a processor architecture with programmable instructions. Additionally, components and/or methods that store information or carry signals can operate based on electrical, optical, and/or magnetic technology, and can include devices such as flip-flops, latches, random access memories, read-only memories, CDs, DVDs, disk drives, or other storage or memory means. The disclosed embodiments and illustrations are exemplary and do not limit the scope of the disclosed technology as defined by the following claims.

What is claimed is:

1. A soft output Viterbi algorithm (SOVA) system for generating error events for decoded bits, the system comprising:
   an add-compare-select (ACS) circuit that determines a winning path through a trellis, generates decoded information based on the winning path, and computes path metric differences from the trellis based on the winning path;
   a trace-back circuit that generates a plurality of error event masks based on the decoded information and the path metric differences;
   an error event metric circuit that calculates an error event metric for each of the plurality of error event masks based on the path metric differences;
   a selection circuit that selects one or more error event masks based on the error event metrics of the plurality of error event masks; and
   an error event optimizer circuit that reduces a bit-length of the selected one or more error event masks and reduces a bit-length of the error event metrics of the selected one or more error event masks.

2. The SOVA system of claim 1, wherein the SOVA system traces back five paths for each bit of the decoded information, wherein the five paths include a first path that merges into a final state of the winning path and four paths that merge into the first path.

3. The SOVA system of claim 2, wherein the selection circuit selects an error event mask associated with the first path.

4. The SOVA system of claim 1, wherein the error event optimizer circuit reduces the bit-length of the selected one or more error event masks from 13 bits to 8 bits and reduces the bit-length of the error event metrics of the selected one or more error event masks from 6 bits to 5 bits.

5. The SOVA system of claim 1, wherein the SOVA system is a dual-bit architecture system.

6. The SOVA system of claim 5, wherein the ACS circuit generates a target bit and a virtual bit and computes path metric differences from the trellis for both the target bit and the virtual bit.

7. The SOVA system of claim 6, wherein the trace-back circuit generates the plurality of error event masks for both the target bit and the virtual bit and wherein the plurality of error event masks for the virtual bit are selected based on decoded information of the target bit.

8. The SOVA system of claim 6, wherein the error event metric circuit calculates error event metrics for the plurality of error event masks for both the target bit and the virtual bit and wherein the error event metrics for the virtual bit are selected based on decoded information of the target bit.

9. The SOVA system of claim 6, wherein the trace-back circuit further comprises a delay line having a multiplexing unit that replaces a delayed virtual bit signal with a modified delayed virtual bit signal.

10. The SOVA system of claim 9, wherein the modified delayed virtual bit signal forms a state index of the trellis that corresponds to user bits associated with both the virtual bit and the target bit.

11. A method for generating error events for decoded bits in a decoder using a soft output Viterbi algorithm (SOVA), the method comprising:
    determining a winning path through a trellis;
    generating decoded information based on the winning path;
    computing path metric differences within the trellis based on the winning path;
    generating a plurality of error event masks based on the decoded information and the path metric differences;
    calculating an error event metric for each of the plurality of error event masks based on the path metric differences;
    selecting one or more error event masks based on the error event metrics of the plurality of error event masks; and
    reducing a bit-length of the selected one or more error event masks and a bit-length of the error event metrics of the selected one or more error event masks.

12. The method of claim 11, wherein generating the plurality of error event masks comprises tracing back five paths for each bit of the decoded information, wherein the five paths include a first path that merges into a final state of the winning path and four paths that merge into the first path.

13. The method of claim 12, wherein selecting the one or more error event masks comprises selecting an error event mask associated with the first path.

14. The method of claim 11, wherein reducing the bit-lengths comprises reducing the bit-length of the selected one or more error event masks from 13 bits to 8 bits and reducing the bit-length of the error event metrics of the selected one or more error event masks from 6 bits to 5 bits.

15. The method of claim 11, wherein the a soft output Viterbi algorithm processes two bits per clock cycle.

16. The method of claim 15, further comprising:
    generating a target bit and a virtual bit; and
    computing path metric differences from the trellis for both the target bit and the virtual bit.

17. The method of claim 16, wherein generating the plurality of error event masks comprises generating error event masks for both the target bit and the virtual bit and wherein the plurality of error event masks for the virtual bit are selected based on decoded information of the target bit.

18. The method of claim 16, wherein calculating error event metrics for the plurality of error event masks comprises calculating error event metrics for both the target bit and the virtual bit and wherein the error event metrics for the virtual bit are selected based on the decoded information of the target bit.

19. The method of claim 16, wherein generating the plurality of error event masks further comprises delaying the target bit and the virtual bit using a delay line having a multiplexing unit that replaces a delayed virtual bit signal with a modified delayed virtual bit signal.

20. The method of claim 19, wherein the modified delayed virtual bit signal forms a state index of the trellis that corresponds to user bits associated with both the virtual bit and the target bit.

* * * * *